US009109791B2

(12) United States Patent
Lin et al.

(10) Patent No.: US 9,109,791 B2
(45) Date of Patent: Aug. 18, 2015

(54) DIGITAL TABLE LAMP AND BASE THEREOF

(71) Applicant: GIGAZONE INTERNATIONAL CO., LTD., New Taipei (TW)

(72) Inventors: Po Yu Lin, New Taipei (TW); Bing Zhou, New Taipei (TW); Dong Jie Tang, New Taipei (TW)

(73) Assignee: GIGAZONE INTERNATIONAL CO., LTD., New Taipei (TW)

( * ) Notice: Subject to any disclaimer, the term of this patent is extended or adjusted under 35 U.S.C. 154(b) by 309 days.

(21) Appl. No.: 13/755,477

(22) Filed: Jan. 31, 2013

(65) Prior Publication Data

US 2013/0329431 A1 Dec. 12, 2013

(30) Foreign Application Priority Data

Jun. 7, 2012 (CN) ...................... 2012 2 0266586 U

(51) Int. Cl.

*H05K 5/00* (2006.01)
*H05K 5/04* (2006.01)
*H05K 5/06* (2006.01)
*F21V 33/00* (2006.01)
*F21S 6/00* (2006.01)
*F21V 21/30* (2006.01)

(52) U.S. Cl.

CPC ............. *F21V 33/0052* (2013.01); *F21S 6/003* (2013.01); *F21V 21/30* (2013.01)

(58) Field of Classification Search

USPC .................................. 361/752–753, 756, 759
See application file for complete search history.

(56) References Cited

U.S. PATENT DOCUMENTS

| | | | | |
|---|---|---|---|---|
| 5,924,787 | A * | 7/1999 | McEllen et al. | 362/263 |
| 6,236,622 | B1 * | 5/2001 | Blackman | 368/10 |
| 6,459,919 | B1 * | 10/2002 | Lys et al. | 600/407 |
| 2007/0121319 | A1 * | 5/2007 | Wolf et al. | 362/231 |
| 2010/0244721 | A1 * | 9/2010 | Shloush et al. | 315/247 |
| 2011/0210676 | A1 * | 9/2011 | Beghelli | 315/185 R |

* cited by examiner

*Primary Examiner* — Tuan T Dinh
(74) *Attorney, Agent, or Firm* — Chun-Ming Shih

(57) ABSTRACT

A digital table lamp includes a support arm, a lamp shade and a base connected with the opposite two ends of the support arm respectively, a circuit board and an optical disk drive. The circuit board and the optical disk drive are located inside the base respectively; the base has a plurality of through holes formed thereon; the circuit board has a plurality of electric connectors disposed thereon; the plurality of electric connectors are positioned corresponding to the plurality of through holes respectively; the optical disk drive is electrically connected to the circuit board and positioned corresponding to an opening, allowing a user to operate the optical disk drive through the opening. Accordingly, the digital table lamp can serve as not only a lighting apparatus but also a computer peripheral.

6 Claims, 4 Drawing Sheets

DIGITAL TABLE LAMP AND BASE THEREOF

BACKGROUND OF THE INVENTION

1. Field of the Invention

The present invention relates to a lighting apparatus, especially to a table lamp.

2. Description of Related Art

As technology moves on, the variety of lamp apparatuses increases every day and it gradually advanced from the traditional fluorescent lamps and tungsten lamps to the state-of-the-art light emitting diode (LED) lamps. Among them, the table lamp is one of the frequently used lighting apparatus. No matter for household or office applications, a table lamp is usually set on a working bench such as an office desk or a studying desk for providing sufficient light and improving working or reading efficiency. However, a conventional table lamp simply functions as a lighting apparatus occupying significant space on the working bench.

Furthermore, following the quick development of computer industry, most people have computers together with the peripheral devices thereof. So the working bench is occupied not only by a table lamp but also by peripheral devices such as an outer optical disk drive (ODD), a hub or a card reader. As a result, very little space is available on the working bench.

Besides, in most cases, a computer will be placed under or, if possible, stored inside a working bench, and the peripheral devices thereof will be electrically connected to the computer through electric cables. Hence, when a user needs to use or check the optical disk drive, USB port, or audio interface located in or on the computer casing, he has to stoop to get the electric cables connected or disconnected. Moreover, when it is inevitable to move or remove the computer casing or the working bench, great inconvenience arises because of the positional difference.

SUMMARY OF THE INVENTION

In view of the prior art, the present invention provides a digital table lamp to solve the problems of the conventional table lamp. The digital table lamp of the present invention has combined other practical functions with the inherent illumination, thus saving a lot of space on the working bench and resulting in a convenient way of plugging or unplugging.

The present invention discloses a digital table lamp which comprises a support arm, a lamp shade, a base, a circuit board and an optical disk drive electrically connected with the circuit board. One end of the support arm is connected to the lamp shade, and the other end of the support arm is connected to the base which includes a casing and a chassis. The casing covers the chassis to form an accommodating space therebetween, and a plurality of through holes and an opening through to the accommodating space are formed on the surface of the casing. The circuit board is located in the accommodating space of the base and is electrically provided with a plurality of electric connector positioned corresponding to the plurality of through holes on the casing respectively. The optical disk drive is located in the accommodating space of the base and partially exposed from the opening of the casing.

The present invention also discloses a base of a digital table lamp, which comprises a chassis, a casing, a circuit board and an optical disk drive. The casing covers the chassis and thereby defines an accommodating space with the chassis. A plurality of through holes and an opening through to the accommodating space are formed on the surface of the casing. The circuit board is located in the accommodating space of the base and electrically provided with a plurality of electric connectors positioned corresponding to the plurality of through holes of the casing respectively. The optical disk drive is electrically connected to the circuit board and is located in the accommodating space and partially exposed from the opening of the casing.

The effect of the present invention may be realized by providing a digital table lamp with a built-in optical disk drive that functions as a lighting apparatus and a peripheral device through the electric cables. In this way, space available on the working bench may be increased. Furthermore, the user may connect other computer peripherals to the computer through the digital table lamp effortlessly without bending forward himself for finding the sockets on the computer, thereby bringing convenience and expediency.

These and other objectives of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENTS

Figure 1:
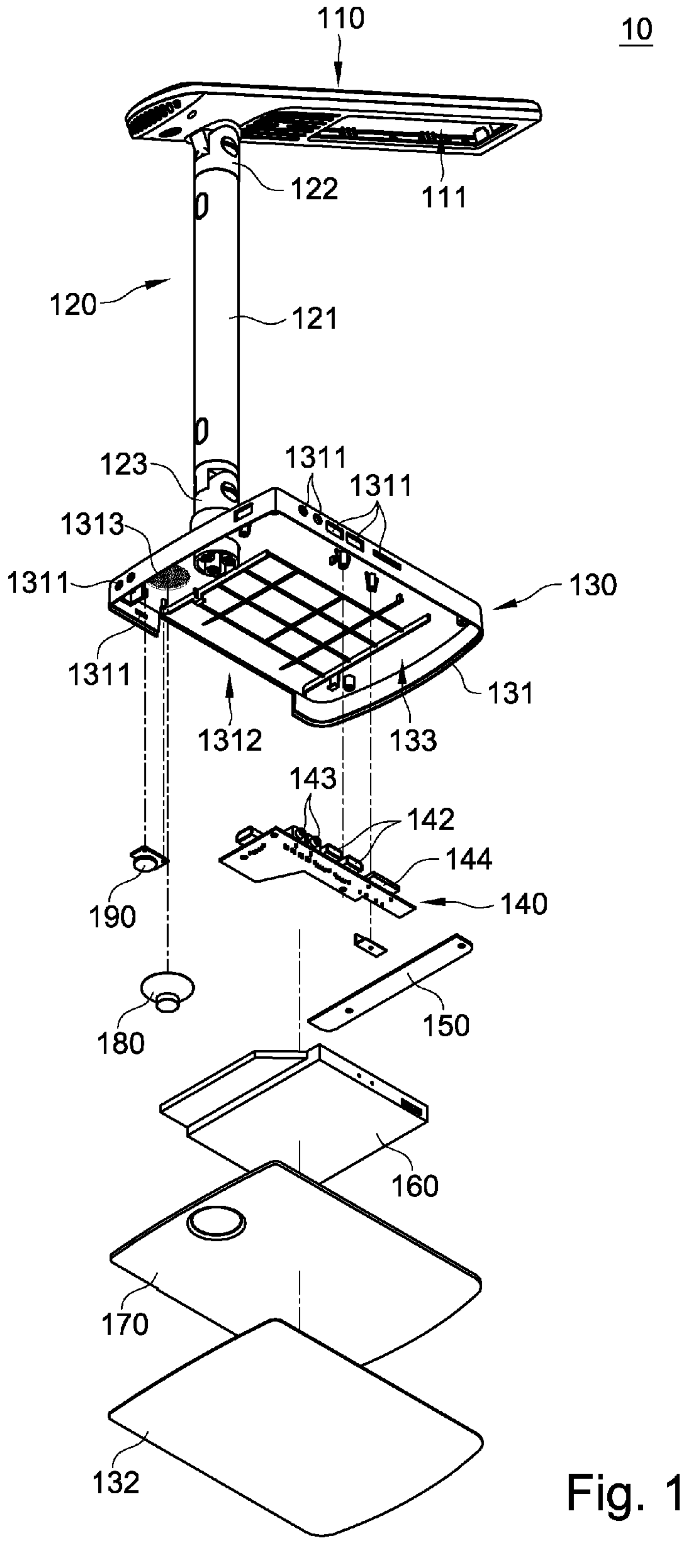
FIG. 1 is a partial breakdown view of the first embodiment of the present invention.
Figure 2:
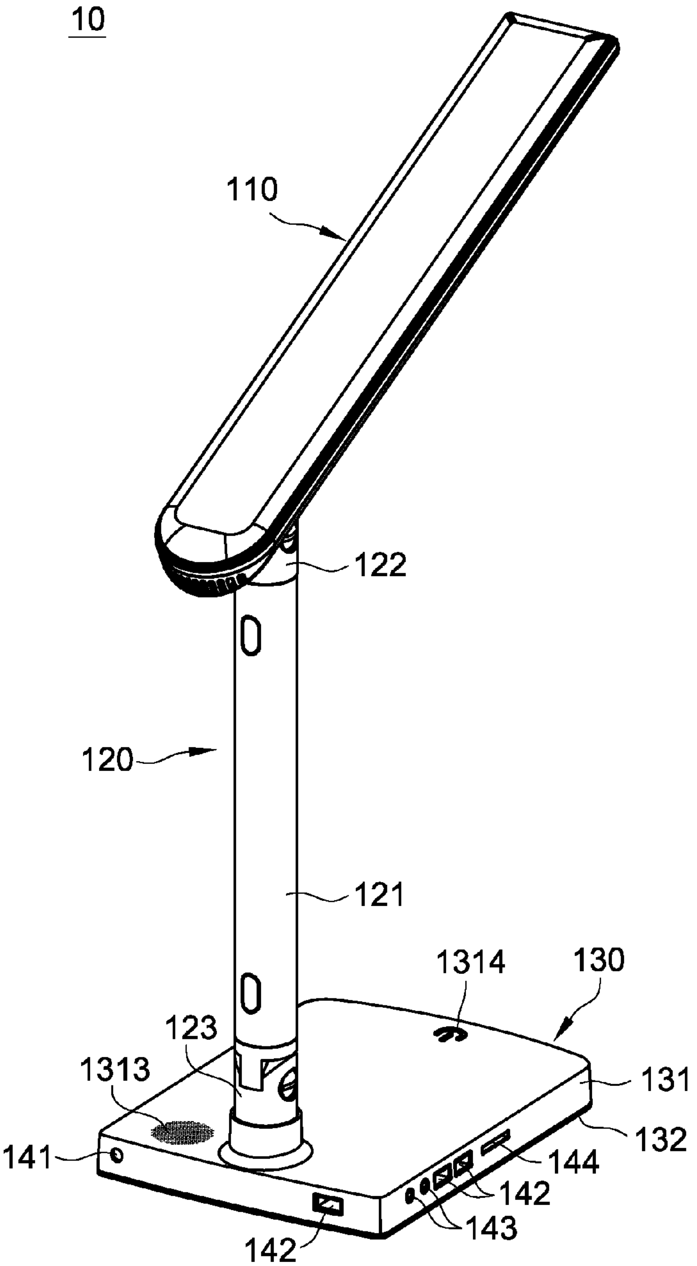
FIG. 2 is a three dimensional view of the first embodiment of the present invention.
Figure 3:
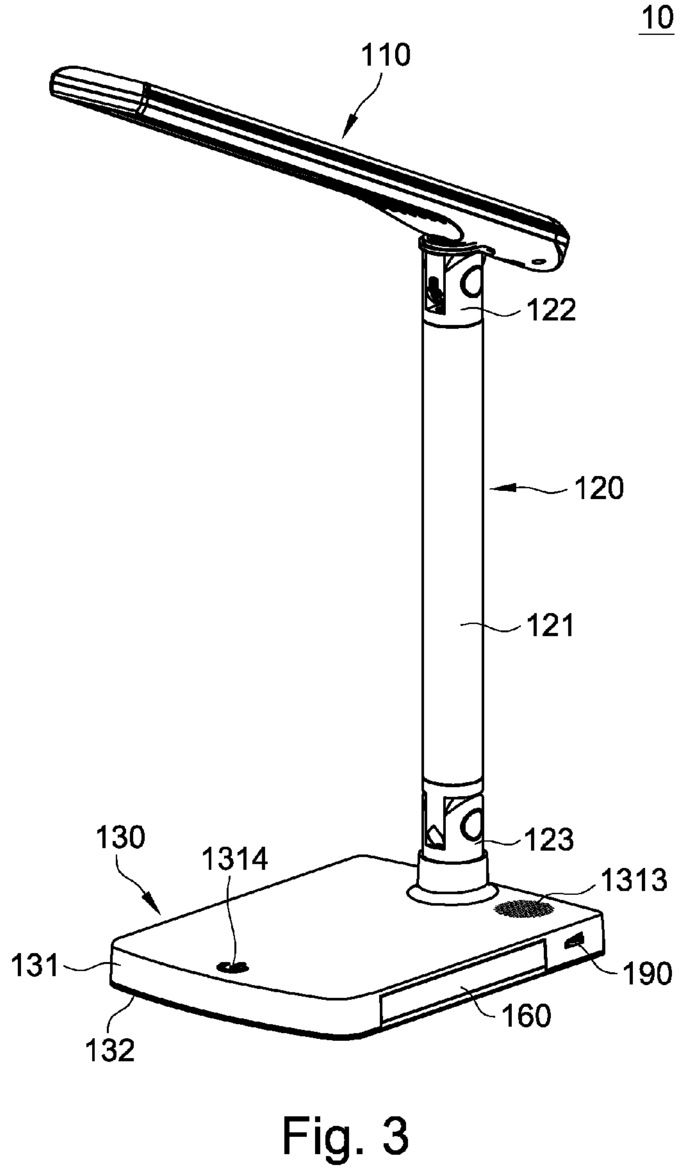
FIG. 3 is a three dimensional view of the first embodiment of the present invention in another viewpoint.

FIG. 1 to FIG. 3 show the digital table lamp 10 of the first embodiment of the present invention including a lamp shade 110, a support arm 120 and a base 130. Besides, an input/output (I/O) circuit board 140, a light control circuit board 150, an optical disk drive 160, a ballast 170, a speaker 180 and a modulation knob 190 are disposed in the base 130.

The lamp shade 110 and the base 130 are connected to two opposite ends of the support arm 120 respectively, and an illuminating unit 111 for emitting light is located at one side of the lamp shade 110 facing the base 130. The support arm 120 includes a rod 121, a first connection part 122 and a second connection part 123. The first connection part 122 and the second connection part 123 are pivoted on two opposite ends of the rod 121 respectively so that they can rotate clockwise or counterclockwise around a first direction parallel to a central axis of the rod 121. Moreover, the lamp shade 110 and the base 130 are pivoted on the first connection part 122 and the second connection part 123 of the support arm 120 so as to be turned around a second direction perpendicular to the first direction respectively. In this way, the relative distance and the included angle between the lamp shade 110 and the base 130 may be adjusted.

The base 130 includes a casing 131 and a chassis 132. The casing 131 is pivotally connected to the first connection part of the support arm 120 and covers the chassis 132 to define an accommodating space 133 in which the input/output circuit board 140, the light control circuit board 150, the optical disk drive 160, the ballast 170, the speaker 180 and the modulation knob 190 are disposed. In addition, on the casing 131 is formed at least one through hole 1311, an opening 1312 and a speaker hole 131 all through to the accommodating space 133. The speaker hole 131 is located on the top of the casing 131; the through holes 1311 and the opening 1312 are respectively located on the side surface of the casing 131. A pressing part 1314 is formed on the top of the casing 131.

On the input/output circuit board 140 are electrically disposed a micro-controller unit (MCU) and one or more electric connectors such as a power connector 141, a universal serial bus (USB) connector 142, an audio input/output interface 143, a card reader connector 144 or a combination thereof. In the present embodiment, the power connector 141 is located on the casing 131 of the base 130 and is further electrically connected to the input/output circuit board 140 through an electric cable, while the USB connector 142, the audio input/output interface 143 and the card reader connector 144 are electrically inserted onto the input/output circuit board 140. It is noted that the aforementioned description is exemplified for illustration only; it should not be considered as a limitation to the present invention. In another embodiment of this invention, the power connector 141 can be independent of the input/output circuit board 140 in the casing 131 of the base 130. In this embodiment, preferably, the power connector 141 is electrically connected to a power shunt through a power line, and the input/output circuit board 140 and the light control circuit board 150 are powered by way of the power shunt.

Besides, in the first embodiment of the present invention, the input/output circuit board 140 can be fastened to the casing 131 by a fastener such as a screw and/or bolt for example. Furthermore, the aforementioned electric connector are positioned corresponding to and passes through the through hole 1311 of the casing 131 to thereby be exposed in part from the base 130. Hence, a person of ordinary skill in the art will appreciate that the number of the through hole 1311 formed on the casing 131 can be determined by the number of the electric connector located on the input/output circuit board 140.

The light control circuit board 150 is electrically connected to the input/output circuit board 140 and the illuminating unit 111 and serves as a power switch in connection with the pressing part 1314 for modulating the light emission of the illuminating unit 111. Although in this embodiment, the touch switch is realized by the light control circuit board 150 cooperating with the pressing part 1314 of the casing 131, the present invention is not limited thereto.

The optical disk drive 160, the speaker 180 and the modulation knob 190 are respectively connected with the input/output circuit board 140, in which the optical disk drive 160 is partially exposed from the opening 1312 of the casing 131 so that the disk tray of the optical disk drive 160 can be ejected through the opening 1312 of the casing 131 outside the base 130 or retrieved inside the base 130. The speaker 180 can be, but not limited to, a horn or a microphone; in addition, the speaker 180 and the modulation knob 190 are positioned respectively corresponding to the speaker hole 1313 and one through hole 1311 of the casing 131, in which the modulation knob 190 is totally or partially exposed from the base 130 via the through hole 1311 and is used to modulate the volume of the speaker 180. In particular, when the speaker 180 is a horn, it can work as a mobile speaker of a portable electronic device. If a decoder is electrically provided on the input/output circuit board 140 for reading and playing audio files in a computer or an external storage device (e.g. a storage card or a flash disk).

The ballast 170 is disposed between the chassis 132 of the base 132 and the optical disk drive 160 to lower the gravity center of the digital table lamp 10 and provide protection for the aforementioned components inside the base 130.

As shown in FIGS. 1-3, based on the aforementioned structure, the power connector 141 of the input/output circuit board 140 can be connected to an external power supply via the through hole 1311 of the base 130 by a power cable, thus allowing the digital table lamp 10 to be powered externally. Besides, when the digital table lamp is placed on a working bench such as an office desk or a studying desk, an electric wire can be connected with the USB connector 142 of the input/output circuit board 140 to form a connection with a computer under the working bench. Accordingly, the digital table lamp 10 can be regarded as a computer peripheral by way of the USB connector 142, the audio input/output interface 143 and the card reader connector 144 provided by the digital table lamp 10. For instance, the user can treat the USB connector 142, the audio input/output interface 143 and/or the card reader connector 144 may serve as a hub port, an audio transmission interface and/or a card reader.

As a result, the present invention allows a user to connect an electronic device such as a portable hard disk, a keyboard or a mouse to the digital table lamp 10 on the working bench without stooping for a socket of the computer under the working bench. Additionally, the user can access the computer through the digital table lamp 10 or operate the optical disk drive 160 on the working bench easily and conveniently. Moreover, regarding an electronic device such as a notebook computer or a tablet computer having no optical disk drive, the optical disk drive 160 connected with the digital table lamp 10 can serve as an external optical disk drive for the electronic device, which is helpful in improving the convenience.

Figure 4:
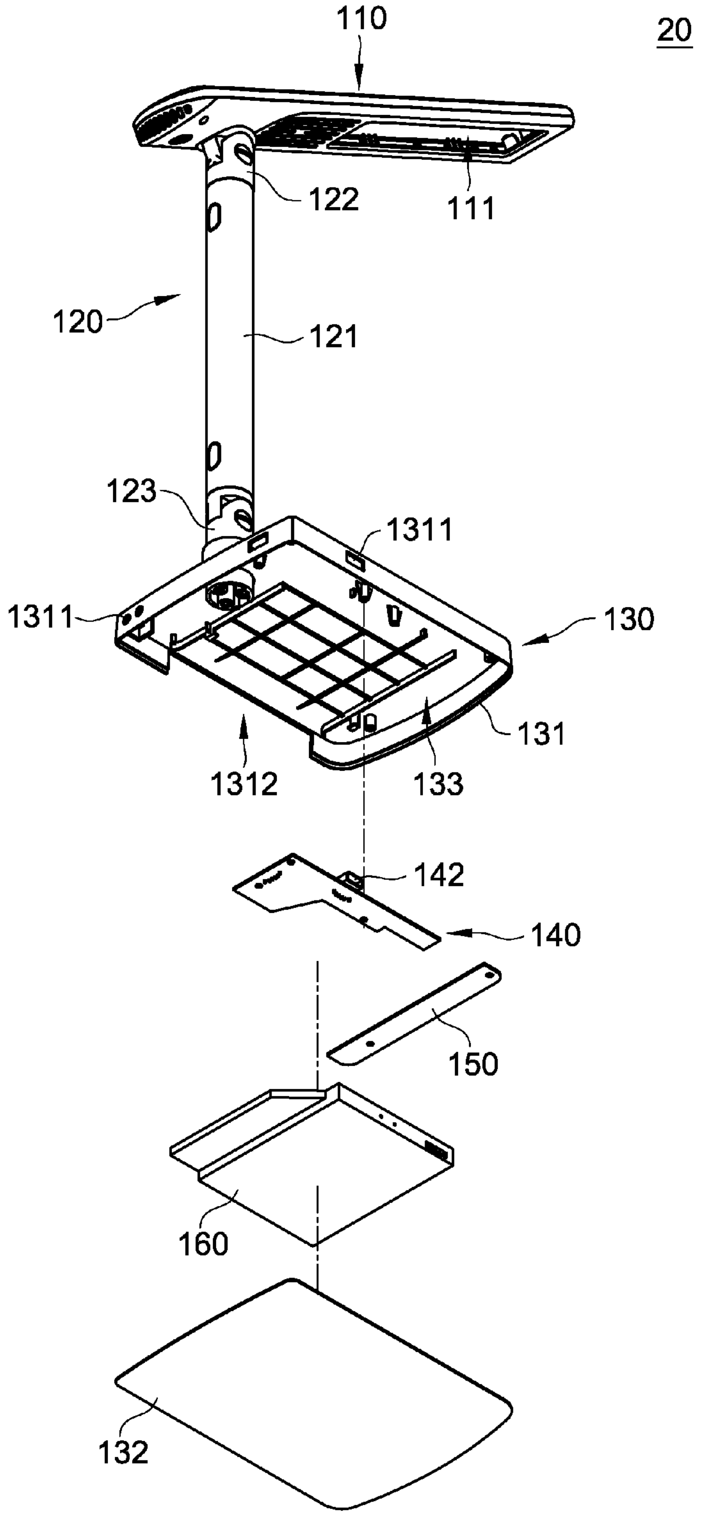
FIG. 4 is a partial breakdown view of the second embodiment of the present invention.

Referring to FIG. 4 illustrating the second embodiment of the present invention, a digital table lamp 10 includes a lamp shade 110, a support arm 120, a base 130, an input/output circuit board 140, a light control circuit board 150 and an optical disk drive electrically connected to the input/output circuit board 140.

The support arm 120 includes a rod 121, a first connection part 122 and a second connection part 123. The first connection part 122 and the second connection part 123 are pivoted on the opposite two ends of the rod 121 respectively and can rotate clockwise or counterclockwise around a first direction parallel to a central axis of the rod 121. Moreover, the lamp shade 110 and the base 130 are pivoted on the first connection part 122 and the second connection part 123 of the support arm 120 respectively and can rotate around a second direction perpendicular to the first direction to allow an adjustment of the relative distance and included angle between the lamp shade 110 and the base 130. In addition, the lamp shade 110 has an illuminating unit 111 therein, that can be, but not limited to a fluorescent lamp or an LED lamp.

The base 130 includes a casing 131 and a chassis 132 and an accommodating space 133 is defined therebetween. The casing 131 is pivoted on the first connection part 121 of the support arm 120 and covers the chassis 132. A plurality of through holes 1311 and an opening 1312 through to the accommodating space 133 are formed on the casing 131 of the base 130 together with a pressing part (not shown)

The input/output circuit board 140, the light control circuit board 150 and the optical disk drive 160 are located in the accommodating space 133 of the base 130. The input/output circuit board 140 is electrically connected to the power connector 141 of the casing 131 of the base 130; meanwhile, a micro-controller unit (MCU) and a USB connector 142 are electrically disposed on the input/output circuit board 140. When the input/output circuit board 140 are fastened to the casing 131, the power connector 141 and the USB connector 142 are positioned corresponding to the through holes 1311 of the casing 131 to be partially exposed from the base 130.

The light control circuit board 150 is connected to the input/output circuit board 140 and the illuminating unit 111 and positioned corresponding to the pressing part 1314 of the casing 131. The light control circuit board 150 and the pressing part 1314 of the casing 131 constitute a power switch for triggering the light generation from the illuminating unit 111. A user pushes the pressing part 1314 to connect with the light control circuit board 150 and further trigger the illuminating unit 111 to emit light. For instance, when the pressing part 1314 of the casing 131 is touched for the first time, the light control circuit board 150 is conductive and the illuminating unit 111 emits light. The light intensity may be increased in proportion to the number of the pressing. In case the pressing part 1314 of the casing 131 is pressed for a longer time, the illuminating unit 111 is stopped from being powered.

The optical disk drive 160 located between the chassis 132 of the base 130 and the input/output circuit board 140, and partially exposed from the opening 1312 of the casing 131 so that the disk tray of the optical disk drive 160 can be ejected or retrieved through the opening 1312 of the casing 131.

Besides, in the first and second embodiments of the present invention, a non-skid pad can be optionally provided on the base 130 of the digital table lamp 10 for improving the stability of the digital table lamp 10 when placed on a working bench.

In view of the above, the digital table lamp of the present invention is advantageous since it can function as a lighting apparatus and a computer peripheral. Thus, the space can be spared for other computer peripherals such as a card reader, an outer optical disk drive or a hub port, and the available space on the working bench is relatively increased.

Moreover, an external electronic device can be connected further with the computer under the working bench through the digital table lamp. A user can also operate the optical disk drive of the digital table lamp on the working bench in a convenient way.

The aforementioned descriptions represent merely the preferred embodiment of the present invention, without any intention to limit the scope of the present invention thereto. Various equivalent changes, alterations, or modifications based on the claims of present invention are all consequently viewed as being embraced by the scope of the present invention.

What is claimed is:

1. A digital table lamp, comprising:

a support arm;

a lamp shade connected to an end of the support arm;

a base connected to the other end of the support arm, including a casing and a chassis covered by the casing, wherein an accommodating space is defined between the casing and the chassis, and an opening and one or more through hole through to the accommodating space are formed on a surface of the casing;

a circuit board located in the accommodating space of the base, on which an electric connector corresponding to the through hole is disposed;

an optical disk drive electrically connected to the circuit board, located in the accommodating space of the base and partially exposed from the opening of the casing; and a light control circuit board located in the accommodating space of the base and electrically connected to the circuit board, wherein the casing has a pressing part disposed thereon and corresponding to the light control circuit board.

2. The digital table lamp of claim 1, wherein the electric connector comprises at least one of a universal serial bus (USB) connector, an audio input/output interface and a card reader connector and a combination thereof.

3. The digital table lamp of claim 1, further comprising an illuminating unit which is disposed at a side of the lamp shade facing the base.

4. The digital table lamp of claim 1, further comprising a ballast which is set on the chassis of the base in the accommodating space of the base.

5. The digital table lamp of claim 1, further comprising a speaker and a modulation knob both electrically connected to the circuit board and located in the accommodating space of the base, wherein the casing of the base includes a speaker hole which corresponds to the speaker and two of the through holes one of which corresponds to the modulation knob, in which the modulation knob passes through the through hole and is partially exposed from the casing.

6. A digital table lamp, comprising:

a support arm;

a lamp shade connected to an end of the support arm;

a base connected to the other end of the support arm, including a casing and a chassis covered by the casing, wherein an accommodating space is defined between the casing and the chassis, and an opening and one or more through hole through to the accommodating space are formed on a surface of the casing;

a circuit board located in the accommodating space of the base, on which an electric connector corresponding to the through hole is disposed; and an optical disk drive electrically connected to the circuit board, located in the accommodating space of the base and partially exposed from the opening of the casing, wherein the support arm includes a rod, a first connection part and a second connection part pivotally connected with the two opposite ends of the rod respectively, the lamp shade is pivotally connected to the first connection part, the base is pivotally connected to the second connection part, the first and second connection parts are able to rotate clockwise or counterclockwise around a first direction parallel to a central axis of the rod, and the lamp shade and the base are able to rotate around a second direction perpendicular to the first direction.

* * * * *